(12) United States Patent
Sun et al.

(10) Patent No.: US 7,808,285 B2
(45) Date of Patent: Oct. 5, 2010

(54) DRIVING CIRCUIT FOR CAPACITIVE LOAD

(75) Inventors: Chi Ping Sun, Hong Kong (CN); Shing Hin Yeung, Hong Kong (CN)

(73) Assignee: Johnson Electric S.A., La Chaux-de-Fonds (CH)

( * ) Notice: Subject to any disclaimer, the term of this patent is extended or adjusted under 35 U.S.C. 154(b) by 0 days.

(21) Appl. No.: 12/344,087

(22) Filed: Dec. 24, 2008

(65) Prior Publication Data

US 2009/0167408 A1   Jul. 2, 2009

(30) Foreign Application Priority Data

Dec. 28, 2007   (CN) .......................... 2007 1 0125691

(51) Int. Cl.
*H03K 3/00* (2006.01)

(52) U.S. Cl. ....................... 327/111; 327/112; 327/423; 327/588

(58) Field of Classification Search ................. 327/111, 327/112, 423, 588
See application file for complete search history.

(56) References Cited

U.S. PATENT DOCUMENTS

| | | | |
|---|---|---|---|
| 6,437,964 B1 * | 8/2002 | Takamura et al. ........... 361/235 |
| 6,862,009 B2 * | 3/2005 | Park .............................. 345/67 |
| 7,170,474 B2 * | 1/2007 | Lee et al. ...................... 345/69 |
| 7,486,286 B2 * | 2/2009 | Kim et al. .................... 345/204 |

* cited by examiner

*Primary Examiner*—Kenneth B. Wells
(74) *Attorney, Agent, or Firm*—Muncy, Geissler, Olds & Lowe, PLLC

(57) ABSTRACT

A power switch assembly for a capacitive load 10 which includes a common electrode 14 and first and second discrete electrodes 16, 18, includes a node n1 coupled to a voltage source Vcc for receiving power there from, a first switching device connected between the node n1 and ground, a second switching device connected between the node n1 and ground, and a dividing circuit connected between the node and ground. The dividing circuit includes an output terminal connected to the common electrode 14 of the capacitive load. The first switching device is coupled to the first electrode 16 of the capacitive load configured to control movement of the capacitive load 10 in a first direction. The second switching device is coupled to the second electrode 18 of the capacitive load configured to control movement of the capacitive load 10 in a second direction reverse to the first direction.

18 Claims, 1 Drawing Sheet

DRIVING CIRCUIT FOR CAPACITIVE LOAD

CROSS REFERENCE TO RELATED APPLICATIONS

This non-provisional patent application claims priority under 35 U.S.C. §119(a) from Patent Application No. 200710125691.8 filed in The People's Republic of China on Dec. 28, 2007.

BACKGROUND OF THE INVENTION

1. Field of the Invention

The present invention relates to a power switch assembly, arrangement or topology for a capacitive load.

2. Description of the Related Art

FIGS. 2a and 2b show a conventional power switch assembly for a capacitive load which has a common electrode on one side thereof and two discrete electrodes on an opposite side thereof. The two electrodes of capacitor C1' represent the common electrode of the capacitive load and one of the two discrete electrodes of the capacitive load, respectively. The two electrodes of capacitor C2' represent the common electrode of the capacitive load and the other one of the two discrete electrodes of the capacitive load, respectively. The capacitor C1' is coupled to the voltage source V1 via four switches S1'~S4' and the capacitor C2' is coupled to the voltage source V2 via four switches S5'~S8'. Usually, the capacitive load is an ultrasonically vibrating element, such as a piezoelectric vibrator. At each time, only one of the voltage sources V1 and V2 is selected to supply power to the capacitor C1' or C2'. When the voltage source V1 is selected to supply power to the capacitor C1', the vibrating element can move in a first direction. When the voltage source V2 is selected to supply power to the capacitor C2', the vibrating element can move in a second direction opposite to the first direction.

However, in the above described conventional power switch assembly, two voltage sources and eight switches are used, which results in the circuitry being complicated and costs being high.

Therefore, an improved power switch assembly for a capacitive load, which overcomes the above mentioned shortcomings, is desired.

SUMMARY OF THE INVENTION

Accordingly, in one aspect thereof, the present invention provides a power switch assembly for a capacitive load having a common electrode and first and second discrete electrodes, the assembly comprises: a node coupled to a voltage source for receiving power therefrom; a first switch connected between the node and the first electrode of the capacitive load, the first switch having a controlling terminal configured to receive a first PWM signal; a second switch connected between the first electrode of the capacitive load and ground, the second switch having a controlling terminal configured to receive a second PWM signal; a third switch connected between the node and the second electrode of the capacitive load, the third switch having a controlling terminal configured to receive a third PWM signal; a fourth switch connected between the second electrode of the capacitive load and ground, the fourth switch having a controlling terminal configured to receive a fourth PWM signal; and a dividing circuit connected between the node and ground, the dividing circuit comprising an output terminal connected to the common electrode of the capacitive load.

Preferably, the first switch is a transistor, the base of the transistor acting as the controlling terminal of the first switch, the collector of the transistor being coupled to the node, the emitter of the transistor being coupled to the first electrode of the capacitive load.

Preferably, the second switch is a transistor, the base of the transistor acting as the controlling terminal of the second switch, the collector of the transistor being coupled to the first electrode of the capacitive load, the emitter of the transistor being grounded.

Preferably, the third switch is a transistor, the base of the transistor acting as the controlling terminal of the third switch, the collector of the transistor being coupled to the node, the emitter of the transistor being coupled to the third electrode of the capacitive load.

Preferably, the fourth switch is a transistor with the base of the transistor acting as the controlling terminal of the fourth switch, the collector of the transistor being coupled to the second electrode of the capacitive load and the emitter of the transistor being grounded.

According to a second aspect thereof, the present invention also provides a power switch assembly comprising: a capacitive load having a common electrode and first and second discrete electrodes; a node coupled to a voltage source for receiving power there from; first switching device connected between the node and ground, the first switching device having an output terminal coupled to the first electrode of the capacitive load configured to control movement of the capacitive load in a first direction; a second switching device connected between the node and ground, the second switching device having an output terminal coupled to the second electrode of the capacitive load configured to control movement of the capacitive load in a second direction reverse to the first direction; and a dividing circuit connected between the node and ground, the dividing circuit comprising an output terminal connected to the common electrode of the capacitive load.

Preferably, the first switching device comprises a first switch connected between the node and the first electrode of the capacitive load, and a second switch connected between the first electrode of the capacitive load and ground, each of the switches having a controlling terminal arranged to receive a PWM signal to control the switches alternatively conducting.

Preferably, the second switching device comprises a third switch connected between the node and the second electrode of the capacitive load, and a fourth switch connected between the second electrode of the capacitive load and ground, each of the third and fourth switches has a controlling terminal arranged to receive a PWM signal to control the third and fourth switches alternatively conducting. When the capacitive load moves in the first direction the third and fourth switches are controlled to not conduct while the first and second switches are controlled to alternatively conduct. When the capacitive load moves in the second direction the first and second switches are controlled to not conduct while the third and fourth switches are controlled to alternatively conduct.

The above switches can be any kinds of power switches, such as transistors, MOSFETs (metal-oxide-semiconductor field-effect transistors), IGBs (Insulated Gate Bipolar Transistors).

Preferably, the dividing circuit comprises a first capacitor and a second capacitor connected between the node and ground in series, a connection between the first capacitor and the second capacitor acting as the output terminal of the dividing circuit and being coupled to the common electrode of the capacitive load.

Preferably, the first and second capacitors have the same value.

BRIEF DESCRIPTION OF THE DRAWINGS

A preferred embodiment of the invention will now be described, by way of example only, with reference to the accompanying drawings, in which.

DESCRIPTION OF THE PREFERRED EMBODIMENTS

Figure 1:
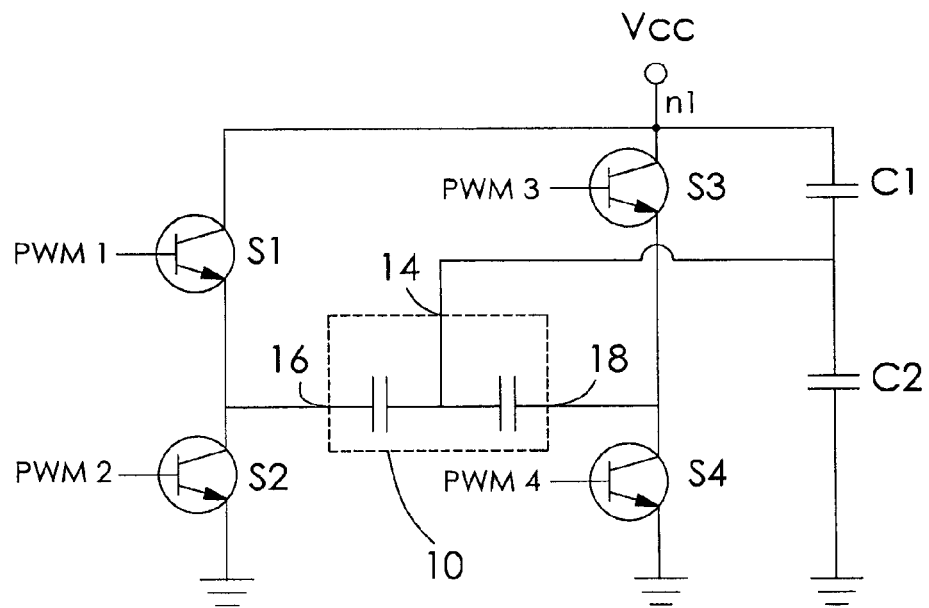
FIG. 1 is a circuit diagram of a power switch assembly according to a first embodiment of the present invention.
Figures 2A, 2B:
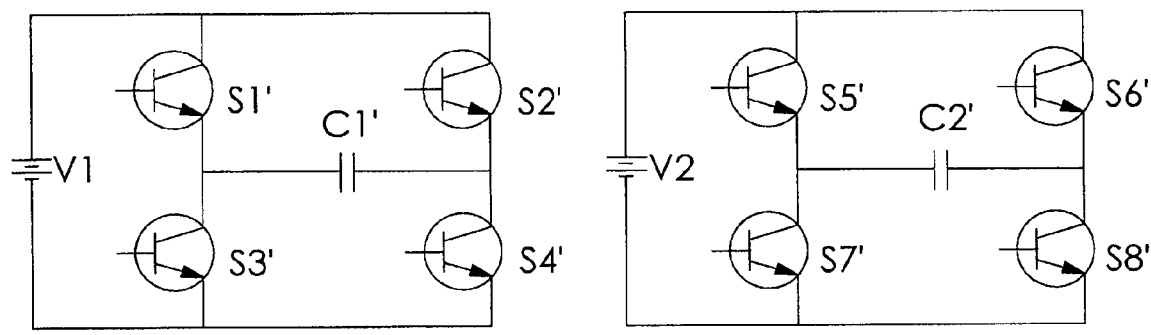
FIGS. 2a and 2b are circuit diagrams of a conventional power switch assembly.

FIG. 1 shows a power switch assembly for a capacitive load according to the preferred embodiment of the present invention. The capacitive load 10 comprises a common electrode 14, and first and second electrodes 16, 18.

The power switch assembly comprises four power switches SI, S2, S3, S4 and two capacitors C1, C2. The switches S1, S2, S3, S4, can be transistors, Metal-Oxide-Semiconductor Field-Effect Transistors (MOSFETs), Insulated Gate Bipolar Transistors (IGBTs), or Gate-Turn-Off Thyristors (GTOs). In the following description of the preferred embodiment of the invention, transistors are used for the switches, by way of illustration. The base of the first transistor S1 is arranged to receive a PWM signal PWM1, the emitter thereof is coupled to the first electrode 16 of the capacitive load 10, and the collector thereof is coupled to the node n1. The node n1 is coupled to a voltage source Vcc for receiving power therefrom. The base of the second transistor S2 is arranged to receive a PWM signal PWM2, the emitter thereof is grounded, and the collector thereof is coupled to the first electrode 16 of the capacitive load 10. The base of the third transistor S3 is arranged to receive a PWM signal PWM3, the emitter thereof is coupled to the electrode 18 of the capacitive load 10, and the collector thereof is coupled to the node n1. The gate of the fourth transistor S4 is arranged to receive a PWM signal PWM4, the emitter thereof is grounded, and the collector thereof is coupled to the second electrode 18 of the capacitive load 10. The two capacitors C1, C2 form a dividing circuit. One electrode of the first capacitor C1 is coupled to the node n1 and the other electrode thereof is coupled to the common electrode 14 of the capacitive load 10. One electrode of the second capacitor C2 is coupled to the common electrode 14 of the capacitive load 10 and the other electrode thereof is grounded.

In the preferred embodiment of the invention, the capacitive load 10 is an ultrasonically vibrating element. The common electrode 14 is disposed on a first surface thereof while the first and second electrodes 16, 18 are disposed on a second surface thereof. The first and second transistors S1 and S2 constitute a first switching device for controlling movement of the vibrating element 10 in a first direction. The third and fourth transistors S3 and S4 constitute a second switching device for controlling movement of the vibrating element 10 in a second direction, which is preferably opposite to the first direction. When the vibrating element 10 moves in the first direction, the first and second transistors S1, S2 are controlled by the PWM signals PWM1, PWM2 to alternately conduct while the third and fourth transistors S3, S4 are controlled to not conduct (turned off). Preferably, the PWM signals PWM1, PWM2 have the same frequency but have 180 degree phase difference. Thus, in one half period, the first transistor S1 turns on while the second transistor S2 turns off. Current flows from the node n1 and passes through the first transistor S1, the vibrating element 10, the second capacitor C2 to ground. The second capacitor C2 is charged while the first capacitor C1 is discharged. In the remained half period, the first transistor S1 turns off while the second transistor S2 turns on. Current flows from the node n1 and passes through the capacitor C1, the vibrating element 10, the second transistor S2 to ground. The second capacitor C2 is discharged while the first capacitor C1 is charged. Of course, the control signals PWM1, PWM2 should be arranged to avoid the transistors S1, S2 shooting through, i.e., to avoid the transistors S1, S2 conducting at the same time. Similarly, when the vibrating element 10 moves in the second direction, the third and fourth transistors S3, S4 are controlled by the PWM signals PWM3, PWM4 to alternately conduct while the first and second transistors S1, S2 are controlled to not conduct. Preferably, the PWM signals PWM3, PWM4 have the same frequency but have 180 degree phase difference. Thus, in one half period, the third transistor S3 turns on while the fourth transistor S4 turns off. Current flows from the node n1 and passes through the third transistor S3, the vibrating element 10, and the second capacitor C2 to ground. In the remained half period, the fourth transistor S4 turns on while the third transistor S3 turns off. Current flows from the node n1 and passes through the capacitor C1, the vibrating element 10, and the fourth transistor S4 to ground. Of course, the control signals PWM3, PWM4 should be arranged to avoid the transistors S3, S4 shooting through, i.e., to avoid the transistors S3, S4 conducting at the same time.

PWM signals PWM1~4 can be provided by a PWM generator. Alternatively, PWM signals PWM1~4 can be provided by a MCU.

As is apparent from the above description, the driving circuit of the piezoelectric motor in accordance with the preferred embodiment uses only four power switches. Therefore, the power switch assembly has a simplified structure with low cost.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow.

The invention claimed is:

1. A driving circuit for a capacitive load which comprises a common electrode and first and second discrete electrodes, comprising:

a node coupled to a voltage source for receiving power therefrom;

a first switch comprising an input terminal connected to the node and an output terminal, the first switch having a controlling terminal configured to receive a first PWM signal;

a second switch comprising an input terminal connected to the output terminal of the first switch, a second node between the output terminal of the first switch and the input terminal of the second switch being configured to connect to the first electrode of the capacitive load, and an output terminal connected to ground, the second switch having a controlling terminal configured to receive a second PWM signal;

a third switch comprising an input terminal connected to the node and an output terminal, the third switch having a controlling terminal configured to receive a third PWM signal;

a fourth switch comprising an input terminal connected to the output terminal of the third switch, a third node between the output terminal of the third switch and the input terminal of the fourth switch being configured to connect to the second electrode of the capacitive load, and an output terminal connected to ground, the fourth switch having a controlling terminal configured to receive a fourth PWM signal; and a dividing circuit connected between the node and ground, the dividing circuit comprising a first capacitor and a second capacitor connected in series between the node and ground, a connection between said first and second capacitors being an output terminal configured to be connected to the common electrode of the capacitive load which results in the voltage of the common electrode being greater than the voltage of ground.

2. The driving circuit of claim 1, wherein, the first capacitor and the second capacitor each charge and discharge alternately when the driving circuit is in operation.

3. The driving circuit of claim 2, wherein the first and second capacitors have the same value.

4. The driving circuit of claim 2, wherein the first switch is a transistor, the base of the transistor acting as the controlling terminal of the first switch, the collector of the transistor being coupled to the node, the emitter of the transistor being coupled to the first electrode of the capacitive load.

5. The driving circuit of claim 2, wherein the second switch is a transistor, the base of the transistor acting as the controlling terminal of the second switch, the collector of the transistor being coupled to the first electrode of the capacitive load, the emitter of the transistor being grounded.

6. The driving circuit of claim 2, wherein the third switch is a transistor, the base of the transistor acting as the controlling terminal of the third switch, the collector of the transistor being coupled to the node, the emitter of the transistor being coupled to the second electrode of the capacitive load.

7. The driving circuit of claim 2, wherein the fourth switch is a transistor, the base of the transistor acting as the controlling terminal of the fourth switch, the collector of the transistor being coupled to the second electrode of the capacitive load, the emitter of the transistor being grounded.

8. The driving circuit of claim 2, wherein the switches are selected from transistors, MOSFETs, IGBTs and GTOs.

9. The driving circuit of claim 1, wherein while the first and second switches are controlled to alternately conduct and the third and fourth switches are controlled to not conduct, current alternately passes through the first electrode of the capacitive load and the common electrode in opposite directions, and while the third and fourth switches are controlled to alternately conduct and the first and second switches are controlled to not conduct, current alternately passes through the second electrode of the capacitive load and the common electrode in opposite directions.

10. A driving circuit comprising:

a capacitive load having a common electrode, and first and second discrete electrodes;

a node coupled to a voltage source for receiving power therefrom;

a first switching device connected between the node and ground, the first switching device having an output terminal coupled to the first electrode of the capacitive load configured to control movement of the capacitive load in a first direction;

a second switching device connected between the node and ground, the second switching device having an output terminal coupled to the second electrode of the capacitive load configured to control movement of the capacitive load in a second direction; and a dividing circuit connected between the node and ground, the dividing circuit comprising a first capacitor and a second capacitor connected in series between the node and ground, a connection between said first and second capacitors being an output terminal connected to the common electrode of the capacitive load.

11. The driving circuit of claim 10, wherein the first switching device comprises a first switch connected between the node and the first electrode of the capacitive load, and a second switch connected between the first electrode of the capacitive load and ground, each of the switches having a controlling terminal arranged to receive a PWM signal to control the switches alternately conducting.

12. The driving circuit of claim 11, wherein the second switching device comprises a third switch connected between the node and the second electrode of the capacitive load, and a fourth switch connected between the second electrode of the capacitive load and ground, each of the third and fourth switches has a controlling terminal arranged to receive a PWM signal to control the third and fourth switches alternately conducting, and wherein when the capacitive load moves in said first direction the third and fourth switches are controlled to not conduct while the first and second switches are controlled to alternately conduct, and when the capacitive load moves in said second direction the first and second switches are controlled to not conduct while the third and fourth switches are controlled to alternately conduct.

13. The driving circuit of claim 12, wherein the switches are selected from transistors, MOSFETs, IGBTs and GTOs.

14. The driving circuit of claim 10, wherein the first and second capacitors have the same value.

15. The driving circuit of claim 10, wherein the capacitive load is an ultrasonically vibrating element, whereby when the first switching device controls current to alternately pass through the first electrode of the ultrasonically vibrating element and the common electrode in opposite directions the ultrasonically vibrating element is caused to move in the first direction, and when the second switching device controls current to alternately pass through the second electrode of the ultrasonically vibrating element and the common electrode in opposite directions the ultrasonically vibrating element is caused to move in the second direction which is opposite to the first direction.

16. The driving circuit of claim 15, wherein the common electrode is disposed on one surface of the ultrasonically vibrating element while the first and second electrodes are disposed on another surface of the ultrasonically vibrating element.

17. A driving circuit for a capacitive load which functions as at least two capacitors and comprises three terminals, first and second terminals respectively connected to one electrode of a corresponding capacitor, a third terminal connected to the other electrode of each of the capacitors, the driving circuit comprising:

a node coupled to a voltage source for receiving power therefrom;

a first capacitor and a second capacitor connected between the node and ground in series, a connection between the first capacitor and the second capacitor configured to connect to the third terminal, the first capacitor and the second capacitor each charging and discharging alternately when the driving circuit is in operation;

a first switching device connected between the node and ground, the first switching device having an output terminal configured to connect to the first terminal to control current to alternately pass through the corresponding capacitor in opposite directions; and a second switching device connected between the node and ground, the second switching device having an output terminal coupled to the second terminal configured to control current to alternately pass through the corresponding capacitor in opposite directions.

18. The driving circuit of claim 17, wherein the capacitive load is an ultrasonically vibrating element, the first switching device controls current to alternately pass through the corresponding capacitor in opposite directions which results in movement of the ultrasonically vibrating element in a first direction, the second switching device controls current to alternately pass through the corresponding capacitor in opposite directions which results in movement of the ultrasonically vibrating element in a second direction which is opposite to the first direction.

* * * * *